US010025200B2

(12) United States Patent
Marsollek et al.

(10) Patent No.: US 10,025,200 B2
(45) Date of Patent: Jul. 17, 2018

(54) OPTIMUM ARRANGEMENT OF ACTUATOR AND SENSOR POINTS ON AN OPTICAL ELEMENT

(71) Applicant: Carl Zeiss SMT GmbH, Oberkochen (DE)

(72) Inventors: Pascal Marsollek, Aalen (DE); Johannes Lippert, Buch am Wald (DE); Jasper Wesselingh, Moettingen (DE); Sascha Bleidistel, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 15/345,938

(22) Filed: Nov. 8, 2016

(65) Prior Publication Data

US 2017/0068165 A1 Mar. 9, 2017

Related U.S. Application Data

(63) Continuation of application No. PCT/EP2015/060701, filed on May 13, 2015.

(30) Foreign Application Priority Data

May 14, 2014 (DE) .................. 10 2014 209 147
May 14, 2014 (DE) .................. 10 2014 209 149
(Continued)

(51) Int. Cl.
*G02B 7/02* (2006.01)
*G03B 27/52* (2006.01)
(Continued)

(52) U.S. Cl.
CPC ......... *G03F 7/706* (2013.01); *G02B 27/0025* (2013.01); *G03F 7/7015* (2013.01);
(Continued)

(58) Field of Classification Search
CPC ............... G02B 27/0025; G03F 7/7015; G03F 7/70191; G03F 7/70258; G03F 7/70266;
(Continued)

(56) References Cited

U.S. PATENT DOCUMENTS 6,307,688 B1 10/2001 Merz et al.
6,760,167 B2 7/2004 Meehan et al.
(Continued)

FOREIGN PATENT DOCUMENTS

DE 10 2005 015 627 A1 10/2006
DE 10 2006 047 666 A1 4/2008
(Continued)

OTHER PUBLICATIONS

German Office Action, with translation thereof, for corresponding DE Appl No. 10 2014 209 147.0, dated Mar. 30, 2015.
(Continued)

*Primary Examiner* — Colin Kreutzer
(74) *Attorney, Agent, or Firm* — Fish & Richardson P.C.

(57) ABSTRACT

A projection exposure apparatus for semiconductor lithography includes a deformable optical element for the correction of wavefront aberrations. Actuating units for the deformation of the optical element are in mechanical contact with the optical element by way of contact regions. The contact regions are arranged in a regular or irregular arrangement outside an optically active region of the optical element. There are contact regions lying closest to the optically active region and remote contact regions.

20 Claims, 16 Drawing Sheets

(30) Foreign Application Priority Data

| May 14, 2014 | (DE) | 10 2014 209 150 |
|---|---|---|
| May 14, 2014 | (DE) | 10 2014 209 151 |
| May 14, 2014 | (DE) | 10 2014 209 153 |
| May 14, 2014 | (DE) | 10 2014 209 160 |

(51) Int. Cl.
<br>    *G03B 27/54*     (2006.01)
<br>    *G03B 27/72*     (2006.01)
<br>    *G03F 7/20*     (2006.01)
<br>    *G02B 27/00*     (2006.01)

(52) U.S. Cl.
<br>    CPC ........ *G03F 7/7095* (2013.01); *G03F 7/70191* (2013.01); *G03F 7/70258* (2013.01); *G03F 7/70266* (2013.01); *G03F 7/70308* (2013.01); *G03F 7/70825* (2013.01)

(58) Field of Classification Search
<br>    CPC .. G03F 7/70308; G03F 7/706; G03F 7/70825; G03F 7/7095; G03F 9/7026
<br>    USPC .................. 355/55, 67, 71; 359/819, 822
<br>    See application file for complete search history.

(56) References Cited

U.S. PATENT DOCUMENTS

| 2001/0033437 | A1 | 10/2001 | Meehan et al. |
| 2003/0001107 | A1 | 1/2003 | Kroon et al. |
| 2006/0139585 | A1* | 6/2006 | Maria Van Der Wijst ................ G03F 7/0266 355/52 |
| 2006/0230413 | A1 | 10/2006 | Rassel et al. |
| 2007/0280609 | A1* | 12/2007 | Ito .......................... G02B 7/003 385/94 |
| 2009/0015947 | A1 | 1/2009 | Holderer et al. |
| 2009/0174876 | A1* | 7/2009 | Schriever ............. G03F 7/70041 355/69 |
| 2010/0128367 | A1 | 5/2010 | Beckenbach et al. |
| 2010/0134891 | A1 | 6/2010 | Mueller et al. |
| 2011/0019169 | A1 | 1/2011 | Conradi et al. |
| 2011/0019171 | A1 | 1/2011 | Schubert et al. |
| 2011/0122383 | A1* | 5/2011 | Grejda ............... G02B 27/0025 355/55 |
| 2011/0292361 | A1* | 12/2011 | Watanabe ........... G03F 7/70308 355/52 |
| 2011/0299053 | A1 | 12/2011 | Steinbach et al. |
| 2014/0268084 | A1* | 9/2014 | Feldmann ........... G03F 7/70266 355/67 |
| 2015/0131067 | A1 | 5/2015 | Baselmans et al. |
| 2015/0370172 | A1* | 12/2015 | Feldmann ........... G03F 7/70258 355/67 |
| 2017/0052453 | A1* | 2/2017 | Deufel ............... G02B 27/0025 |
| 2017/0108780 | A1* | 4/2017 | Eva ....................... G03F 7/7015 |

FOREIGN PATENT DOCUMENTS

| DE | 10 2008 040 613 A1 | 1/2009 | |
| DE | 10 2007 045 975 A1 | 4/2009 | |
| DE | 102013204391 B3 * | 5/2014 | ............ G02B 13/14 |
| EP | 1 014 139 B1 | 3/2003 | |
| EP | 1 385 034 A1 | 1/2004 | |
| EP | 1 677 154 A2 | 7/2006 | |
| WO | WO 2011/062812 A2 | 5/2011 | |

OTHER PUBLICATIONS

German Office Action, with translation thereof, for corresponding DE Appl No. 10 2014 209 160.8, dated Mar. 27, 2015.
International Search Report and Written Opinion for corresponding PCT Appl No. PCT/EP2015/060701, dated Aug. 12, 2015.

\* cited by examiner

OPTIMUM ARRANGEMENT OF ACTUATOR AND SENSOR POINTS ON AN OPTICAL ELEMENT

CROSS-REFERENCE TO RELATED APPLICATION

The present application is a continuation of, and claims benefit under 35 USC 120 to, international application PCT/EP2015/060701, filed May 13, 2015, which claims benefit under 35 USC 119 of German Application Nos. 10 2014 209 147.0; 10 2014 209 149.7; 10 2014 209 160.8; 10 2014 209 150.0; 10 2014 209 151.9 and 10 2014 209 153.5, filed May 14, 2014. The entire disclosure of international application PCT/EP2015/060701 and German Application Nos. 10 2014 209 147.0; 10 2014 209 149.7; 10 2014 209 160.8; 10 2014 209 150.0; 10 2014 209 151.9 and 10 2014 209 153.5 are incorporated by reference herein.

FIELD

The disclosure relates to a projection exposure apparatus for semiconductor lithography with a manipulator for image error correction.

BACKGROUND

The known way in which projection exposure apparatuses for semiconductor lithography work is based on the idea that structures, that is to say for example conductor tracks, but also transistors or the like, are produced on semiconductor components by an image of structures that are present on a mask, known as a reticle, being projected via a lens onto a photosensitive resist arranged on a semiconductor wafer and by the desired topography of the component being produced sequentially in subsequent steps, in particular by corresponding coating or etching processes. This generally involves the lens bringing about a considerable reduction in the size of the structures that are present on the reticle, usually by 4-10 times.

Produced structures can have dimensions in the range of several nanometers, which can impose considerable desired properties for the quality of the lens that is used for the exposure. In particular, it is desirable to be able to compensate for any image errors as quickly as possible and in a way appropriate for the situation. So-called manipulators may be used for example for error correction. Such manipulators may in particular include optical elements, which can be moved or deformed via suitable actuators for locally influencing a wavefront.

A corresponding concept is described in European Patent EP 1 014 139 B1. The document mentioned discloses, inter alia, a projection exposure apparatus that includes a manipulator with an optical element, such as for example a lens or mirror, which is deformed in a specifically selective manner by actuating units for purposes of optical correction. In EP 1 014 139 B1, the concept pursued there is explained on the basis of a deformable lens.

SUMMARY

It has been found that known manipulators may not optimally suitable for the correction of all image errors. Overlay errors for example involve correction concepts that cannot be realized in an optimum way via the manipulators known from the prior art. With concepts known so far, it is generally possible with difficulty to realize high degrees of waviness on optical elements, which may be involved in particular for the correction of overlay errors. The waviness is in this case a measure of how many wave peaks or wave troughs occur in a cross-sectional representation of the optical element over the entire lateral extent of the optical element.

The disclosure seeks to provide a projection exposure apparatus for semiconductor lithography that offers extended possibilities for the correction of image errors, in particular for the correction of overlay errors.

A projection exposure apparatus for semiconductor lithography has a deformable optical element for the correction of wavefront aberrations, there being actuating units for the deformation of the optical element, which are in mechanical contact with the optical element by way of contact regions. The contact regions are in this case arranged in a regular or irregular arrangement outside an optically active region of the optical element and there are contact regions lying closest to the optically active region and remote contact regions.

In particular, the contact regions lying closest to the optically active region of the optical element may be arranged with respect to their center point at a distance of 3 mm to 12 mm from the edge of the optically active region. This allows the forces, and consequently the stresses, in the optical region to be kept as low as possible, whereby component failure can be prevented.

Furthermore, the distance of the center points of the contact regions that are remote from the optically active region to the center points of the closest contact regions may lie in the range of 2 to 10 mm.

The distance of the center points of the contact regions of one row advantageously lies in the range between 8 and 30 mm.

In a further advantageous embodiment, the contact regions in at least two rows are arranged offset from one another.

In addition, the measuring points for sensors may be arranged offset from the contact regions, in particular on the same face of the optical element. This makes it possible to both actuate and measure from the same side of the optical element, whereby, on the side that is opposite from this side, the optical element can be brought up comparatively close to adjacent components of a projection exposure apparatus (for example to the reticle).

Alternatively, the measuring points may be arranged on the side of the optical element that is opposite from the contact regions.

Advantageously, the measuring points are arranged in at least two rows, whereby the drift behavior of the sensors can be controlled better.

BRIEF DESCRIPTION OF THE DRAWINGS

Advantageous embodiments and variants of the disclosure are explained by way of example below on the basis of the drawings, in which.

DETAILED DESCRIPTION

Figure 1:
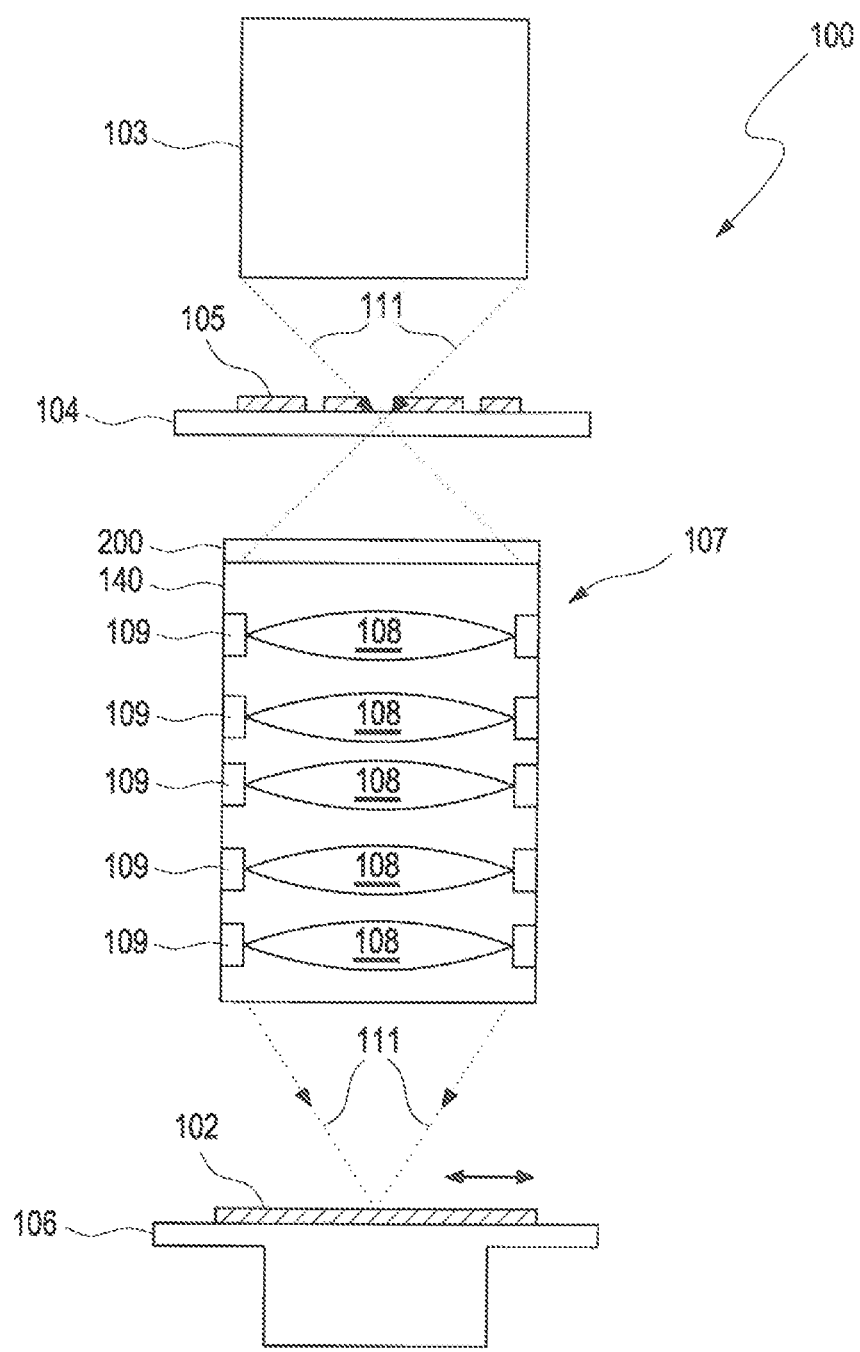
FIG. 1 shows a schematic representation of a projection exposure apparatus according to the disclosure.

In FIG. 1, a projection exposure apparatus 100 according to the disclosure is represented. This apparatus serves for the exposure of structures on a substrate which is coated with photosensitive materials, generally consists predominantly of silicon and is referred to as a wafer 102, for the production of semiconductor components, such as computer chips.

The projection exposure apparatus 100 in this case consists essentially of an illumination device 103, a device 104 known as a reticle stage for receiving and exactly positioning a mask provided with a structure, a so-called reticle 105, by which the later structures on the wafer 102 are determined, a device 106 for holding, moving and exactly positioning the wafer 102 and an imaging device, to be specific a projection lens 107, with multiple optical elements 108, which are held by way of mounts 109 in a lens housing 140 of the projection lens 107.

The basic functional principle in this case provides that an image of the structures introduced into the reticle 105 is projected onto the wafer 102, the imaging generally being on a reduced scale.

The illumination device 103 provides a projection beam 111 in the form of electromagnetic radiation, which is involved for the imaging of the reticle 105 on the wafer 102. A laser, plasma source or the like may be used as the source of this radiation. Optical elements in the illumination device 103 are used to shape the radiation in such a way that, when it is incident on the reticle 105, the projection beam 111 has the desired properties with regard to diameter, polarization, form of the wavefront and the like.

An image of the reticle 105 is produced by the beams 111 and transferred from the projection lens 107 onto the wafer 102 in an appropriately reduced form, as already explained above. In this case, the reticle 105 and the wafer 102 may be moved synchronously, so that images of regions of the reticle 105 are projected onto corresponding regions of the wafer 102 virtually continuously during a so-called scanning operation. The projection lens 107 has a multiplicity of individual refractive, diffractive and/or reflective optical elements 108, such as for example lens elements, mirrors, prisms, terminal plates and the like.

The arrangement of the manipulator 200 in the region between the reticle stage 104 and the first optical element of the projection lens 107 can also be seen well in FIG. 1.

Figure 2:
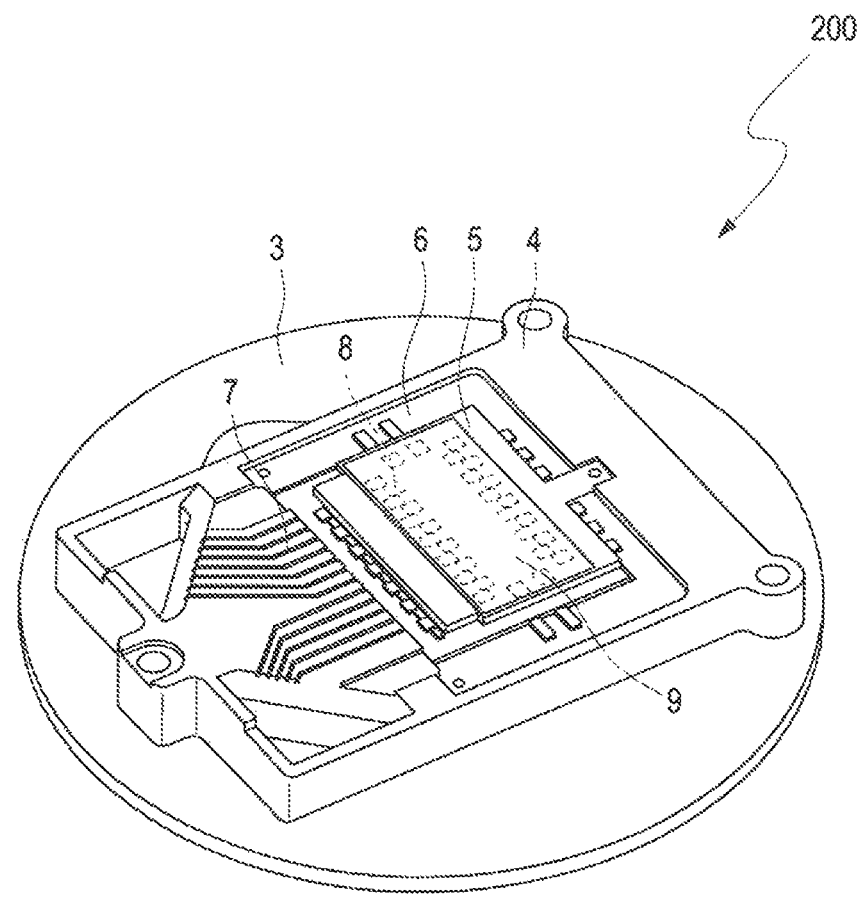
FIG. 2 shows a schematic representation of an embodiment of a manipulator in which the disclosure can be used.

In FIG. 2, a manipulator 200 in which the disclosure can be used is schematically represented in somewhat more detail in a perspective representation. The manipulator 200 is in this case connected, in particular screwed, to the mount 3 of the first optical element of the projection lens by way of a base frame 4. In the present example, the base frame 4 is connected to the projection lens by a 3-point connection, which makes it easily possible for it to be reproducibly exchangeable. In the example shown, one function of the base frame 4 is to receive both a sensor frame 5 and a supporting frame 6, which will be discussed in more detail below. It is in this case advantageous if the base frame 4 provides a mechanical decoupling between the supporting frame and the sensor frame 5, 6, i.e. it is intended to be ensured that deformations of the supporting frame 6 have no mechanical effects on the sensor frame 5. Furthermore, the base frame 4 holds the two aforementioned frames 5 and 6 in relation to the projection lens and decouple deformations from the supporting frame 6 with respect to the surroundings. In addition, the base frame 4 also receives the desired external interfaces, such as for example connectors, covers or the like. The base frame 4 is advantageously produced from a non-magnetic material, such as for example titanium, a non-magnetic steel or a ceramic, in order to minimize as much as possible influences that could be caused by the magnetic Lorentz drives of the reticle stage. Grooves 7 for routing cables, fibers or the like can likewise be seen in FIG. 2.

The supporting frame 6 supports the optical element 9 of the manipulator 200 by way of the actuating units 8 and not only takes the weight of the optical element 9 but also absorbs the forces from the actuating units 8, in particular in the case of a (desired) deformation of the optical element 9.

In the present example, the optical element 9 consists of quartz glass; in its basic form, it is formed as a plane-parallel plate and has the dimensions in the range of 50-100×100-200×1-4 mm, in particular of 65-85×120-160×2.3-3.3 mm. It goes without saying that other dimensions and materials are also conceivable. The use of quartz glass has proven to be advantageous, by contrast in particular with calcium fluoride in which crystal lattice dislocations have a tendency to migrate, which would have an adverse effect overall on the optical and mechanical performance of the optical element and the manipulator.

In the example shown, the supporting frame 6 is connected on its underside to the base frame 4. It is of advantage for the supporting frame 6 to be of a form that is as stiff as possible, it being possible for the supporting frame 6 to be produced in particular from a ceramic material or else—in a way similar to the base frame 4—from a non-magnetic steel. In an alternative to the solution shown, the supporting frame 6 may also be omitted. In this case, the actuating units 8 would be received directly by the base frame 4. As already mentioned and shown in the figure, the base frame 4 is connected not only to the supporting frame 6 but also to the sensor frame 5. The sensor frame 5 may for example carry capacitive sensors or else optical sensors and may in particular be formed from titanium or aluminum or corresponding alloys or from ULE or Zerodur or silicon-infiltrated silicon carbide (SiSiC). An adaptation of the coefficient of thermal expansion of the sensor frame 5 to that of the base frame 4 is in this case of advantage. Furthermore, the sensor frame 5 may be formed from a material that has a CTE value of at most 0-12 ppm/K. In addition, it is of advantage if the sensor frame is formed from a material that has a modulus of elasticity value of 60-400 GPa. The sensor frame 5 is mechanically decoupled from the base frame 4 in such a way that deformations of the base frame 4 are not also manifested as deformations of the sensor frame 5. Possibilities of adjustment may be provided both in the supporting frame 6 and in the sensor frame 5, in order to position the actuating units 8 or the sensors in all degrees of freedom; in particular, so-called spacers may be used here, that is to say spacing rings or spacing elements. In this case, an adjustment in the acting direction of the actuating units 8 or in the measuring direction of the sensors is of particular importance. Connecting elements may be used not only for connecting the sensor frame 5 to the base frame 4 but also for connecting the supporting frame 6 to the base frame 4 and the base frame 4 to the projection lens, it being possible for the connecting elements to have a decoupling effect or for additional decoupling elements to be present. It is in this case of advantage if the connecting elements or the decoupling elements are designed to be as flexible as possible in the radial direction and as stiff as possible in the z direction, that is to say in the direction of the optical axis. This can be achieved for example by the use of appropriately aligned and designed leaf springs.

As already mentioned, in addition to the variant of a manipulator 200 that is represented in FIG. 2, it is conceivable that the supporting frame 6 and/or the sensor frame 5 are omitted, i.e. that both sensors and actuating units are arranged directly on the base frame 4.

Figure 3:
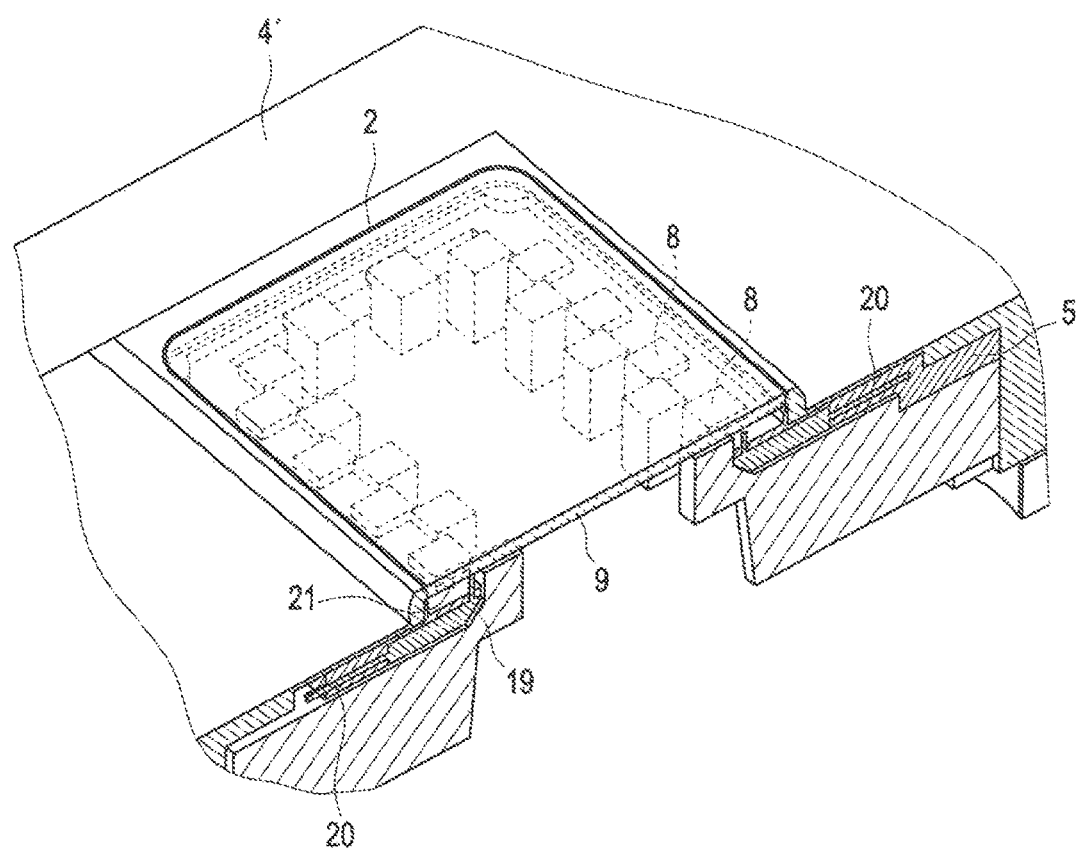
FIG. 3 shows a schematic sectional representation of a manipulator.

In FIG. 3, a sectional view of an alternative embodiment of the manipulator is schematically represented. In this embodiment, the base frame 4' is formed in such a way that it largely covers the sensor frame 5, and consequently extends essentially right up to the edge regions of the optical element 9. In the sensor frame 5, a light beam is coupled out from a fiber 20, runs freely in optical terms over a certain distance and is incident on a prism 19, which deflects it in the direction of the glass surface 21. The reflection at the glass surface 21 subsequently produces a self-interference of the light beam, which can be evaluated in a downstream evaluation unit (not represented here), so that the deflection of the optical element 9 at the particular time that is brought about by the actuating units 8 at the corresponding location can be determined. Alternatively, a capacitive measurement may also take place; in this case, a metallization, and possibly a grounding, of the optical element 9 in the region of the measuring points is of advantage. Likewise shown in FIG. 3 is a seal 2, running around the optical element 9, between the optical element 9 and the base frame 5. The seal 2 may in particular be produced from an elastomer such as for example FKN (tradename Viton). Alternatively, an elastic adhesive may also be used in the manner of an elastic (expansion) joint. Very low rigidity is a desired mechanical property for the sealing compound that is used, in order to make a certain allowance for aging of the seal possible.

Figure 4:
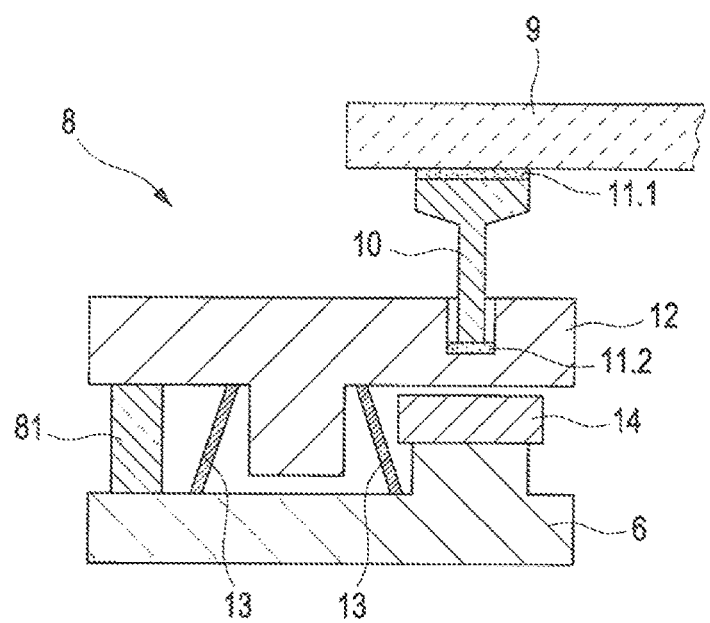
FIG. 4 shows a schematic representation of an exemplary embodiment of an actuating unit with a sensor.

In FIG. 4, an exemplary embodiment of an actuating unit 8 with a sensor 14 for the indirect measurement of deformations of the optical element 9 is schematically represented. The actuator 81 is used to deflect a lever 12, which is mounted by leaf springs 13. In this case, the leaf springs 13 and the actuator 81 are for their part connected to the supporting frame 6. The lever 12 is in mechanical connection with the optical element 9 by way of a plunger 10 and two connecting layers 11.1 and 11.2, which are realized for example by using an adhesive. The mechanical connection 11.2 is not absolutely necessary here; it may however be of advantage for servicing reasons (repair of the component and so on).

On the side opposite from the actuator 81, the supporting frame 6 has the sensor 14. In the present example, the measurement of the deformation of an optical element 9 takes place via the sensor 14 in the actuating unit 8. The determined movement that is transferred by the actuating unit 8 to the optical element 9 by way of the lever 12 and the plunger 10 can then be used to infer the deflection or the position of the surface of the optical element 9. In the example shown, a certain measuring uncertainty is caused, inter alia, by the two connecting layers 11.1 and 11.2, where a drift may occur, which may lead to a falsification of the measuring result. Alternatively, force sensors may be used for measuring the deformation of the optical element 9. Such a measurement has in particular the advantage of greater robustness of the measuring result with respect to crosstalk from other measuring axes. In other words, the influence of the movement of other axes on the measuring signal of an axis (for example when measuring in the actuating unit) is less influenced. However, here there is a certain difficulty in that parasitic forces are introduced into the system by the movement of the reticle stage and can have the effect that the measuring result is likewise falsified.

In principle, an actuation (that is to say a deformation and/or a deflection) of the optical element without the use of sensors, that is to say a controlled actuation, is also conceivable. In this case there are however increased desired properties for the accuracy and resolution of the actuating unit to achieve a satisfactory result in the setting of the desired deformation. Force actuating units or position actuating units may be used. Typical examples of force actuating units are plunger coils, pneumatic or hydraulic actuating units or else reluctance actuating units. This variant is distinguished by low rigidity between the optical element and the frame on which the actuating units are mounted.

Examples of position actuating units are piezo actuators, possibly magnetic shape-memory elements or else stepping motors; which are distinguished by a high degree of stiffness between the optical element and the frame on which the actuating units are mounted. The use of piezo actuators, in particular piezo stacks, additionally allows a comparatively precise positioning to be achieved with little development of heat—for example in comparison with Lorentz actuators.

In principle, by using appropriate additional elements such as springs or levers, force actuating units can be converted into position actuating units, and vice versa. A decisive factor for the actuating concept is the resultant stiffness between the optical element and the frame on which the actuating unit is arranged.

Figure 5:
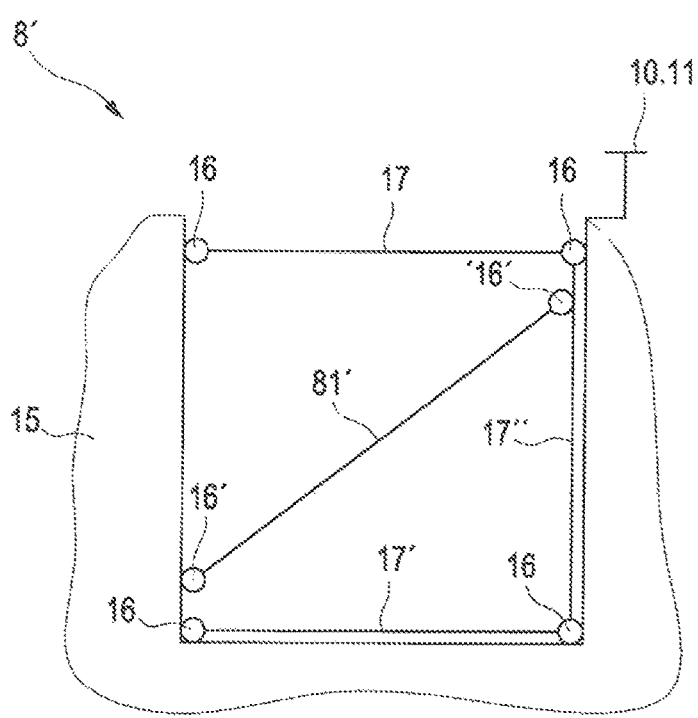
FIG. 5 shows a schematic representation of a further embodiment of an actuating unit.

FIG. 5 schematically shows an alternative configuration of an actuating unit 8', in which so-called parallel kinematics are used. In the case that is shown, the actuating unit has an actuating body 15, which is connected by way of flexures 16 to two essentially parallel running beams 17 and 17', and with these and a further beam 17" forms a parallelogram. In this case, a plunger 10.11 is arranged on the further beam 17" for the actuation of an optical element. The actuator 81', which is connected likewise by way of flexures 16' to the actuator body 15, extends in a diagonal of the parallelogram. When there is an extension or shortening of the actuator 81', which may in particular be configured as a piezo stack, the two beams 17 and 17' move in parallel, so that an actuation of an optical element that is not shown in the figure can take place by way of the actuating unit 8'. As compared with an actuation by way of levers, in particular tilting levers, the advantage of the solution shown is essentially that, in the variant that is shown in the figure, there is not such a great change in the parasitic forces and moments when there is movement of other regions, for example in the case of a change in the deformation profile of the optical element, which is extremely advantageous from the aspect of optical performance.

Possible combinations of actuating units and sensor types for a controlled deformation/deflection of the optical element are compiled by way of example below.

Position Actuating Unit/Position Measurement

Distinguished by a stiff actuating unit. The optical element is in this case measured via a position sensor that is sufficiently robust with respect to crosstalk from other regions, possibly a contactless position sensor, for example directly, via an external mechanism or in the actuating unit itself.

Examples

Piezo actuating unit, interferometric position measurement

Piezo actuating unit, capacitive position measurement

Piezo actuating unit, mechanics, capacitive position measurement

Stepping-motor actuating unit, encoder

The use of capacitive sensors is conceivable in particular in cases in which the sensor measures the deflection of a component of an actuating unit. In principle, however, it is also possible to measure deflections or deformations of the optical element directly with a capacitive sensor. In this case, a conductive coating of the region addressed by the sensor on the surface of the optical element, for example a metallization, may be advantageous.

In the case of the use of an interferometric sensor for the position measurement, the use of a fiber-coupled interferometer comes into consideration in particular. It is similarly possible to use fiber Bragg gratings, which make multichannel measurement easily possible by using individual sensors connected in series, so that all of the sensors addressed can be interrogated with a single fiber.

Force Actuating Unit/Position Measurement

Distinguished by a sufficiently accurate (typically in the single-digit nm range) actuating unit. The optical element is in this case measured via a sufficiently accurate, possibly contactless, position sensor, for example directly, via an external mechanism or in the actuating unit itself.

Examples

Plunger-coil actuating unit, interferometric position measurement

Reluctance actuating unit, capacitive position measurement

Pneumatic or hydraulic actuating unit, encoder

Force Actuating Unit/Force Measurement

Distinguished by a sufficiently accurate (see above) actuating unit. The forces acting on the optical element are measured via a stiff force sensor in the force path.

Example

Plunger-coil actuating unit on load cell.

Position Actuating Unit/Force Measurement

Distinguished by a very rigid actuating unit that is robust with respect to crosstalk. The forces acting on the optical element are measured via a stiff force sensor in the force path.

Example

Piezo actuating unit with a strain gauge.

Figure 6:
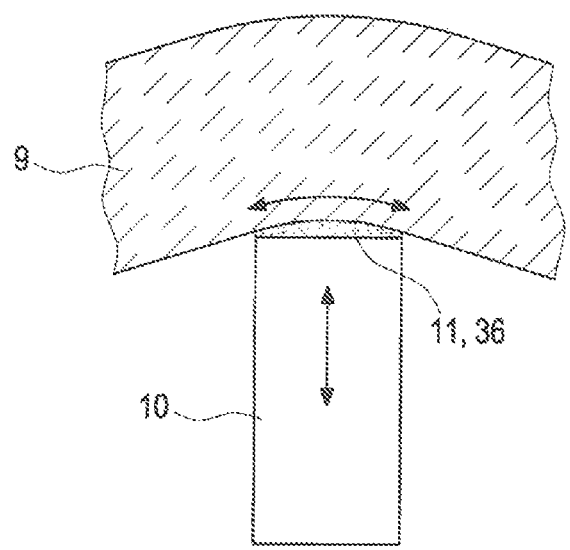
FIG. 6 shows a first possibility for the introduction of forces into an optical element.

The conditions in the area surrounding the region of an optical element on which actuator forces act is to be illustrated once again on the basis of FIG. 6, in a sectional partial representation. The optical element 9 may in this case be the optical element that is used in the manipulator shown above; in principle, the solutions that are represented in the following figures can however be applied to a large number of extremely varied actuated optical elements. In the variant that is shown in the figure, the optical element 9 for the introduction of forces via a an actuable plunger 10 is in connection by way of a connecting layer 11, in particular a layer of adhesive or a soldered connection. The actuating force is in this case indicated by the double-headed arrow. As a difference from the solutions known from mounting technology, in particular of lens elements in projection lenses, in which optical elements are mounted directly on possibly actuable spring legs, here there is no direct contact between the plunger 10 and the material of the optical element 9, but instead the forces from the plunger 10 are transferred to the optical element 9 by way of the material of the connecting layer 11. The introduction of force serves in the present case less for a movement of the optical element 9 as a whole, but rather for a local deformation of the optical element 9, for example for the setting of a desired waviness over the optical element 9. However, as represented in the figure, the local deformation may be manifested in particular by a bending of the optical element 9 also in the region of the connecting layer 11—referred to hereinafter as the contact region 36—which may lead to undesired stresses in the connecting layer 11, and consequently to creepage or degradation, even to the extent of the connecting layer 11 being destroyed.

The contact region 36 may have a maximum lateral extent or, in the case of a circular form of the contact region 36, a diameter of about 2-15 mm, in particular of about 3-6 mm; the connecting layer 11 may have a thickness of about 20 μm-400 μm, in particular of about 90-130 μm. A reduction in the thickness of the connecting layer would lead to reduced creepage as a result of the connecting layer, so that it is possible or desirable for the connecting layer to be chosen to be thinner. High-grade steel X14 or X17, Invar or else TiAl6V4 or other titanium alloys may be used for the material of the plunger. As a result of the non-magnetic properties, in particular of the last-mentioned material, a harmful influence of the magnetic fields emanating from the reticle stage, such as for example magnetostriction, is minimized. In addition, TiAl6V4 proves to be advantageous because it has a coefficient of thermal expansion that is closer to the coefficient of expansion of the optical element than the non-magnetic steels that likewise come into consideration.

Figure 7:
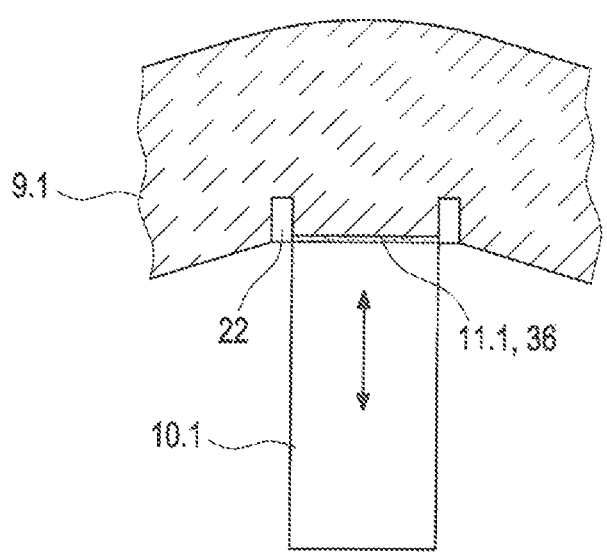
FIG. 7 shows a further possibility for the introduction of forces into an optical element.

FIG. 7 likewise shows in a sectional representation of a detail a variant in which bending of the optical element 9.1 in the contact region 36 is reduced. Here, too, a plunger 10.1 acts by way of the contact region 36 on the optical element 9.1 for the specifically selective deformation thereof. An annular peripheral groove 22 running around the contact region 36 is clearly visible. The effect of the groove 22 is essentially that, when there is a deformation of the optical element 9.1, the curvature or bending of the surface areas in the contact region 36 is reduced, and consequently the connecting layer 11.1 remains under low stress. The groove 22 displaces the flexural stresses occurring into the interior of the optical element 9.1. With a sufficient depth of the groove 22, it acts together with the material of the optical element 9.1 that remains in the area surrounding it in the manner of an articulated joint.

It goes without saying that the peripheral groove does not necessarily have to be of an annular form. Depending on the design of the contact location, it is conceivable for the groove to follow different paths.

The flexural stress in the contact region 36 is therefore essentially reduced, while the compressive stress that is of course involved for the actuation or deformation of the optical element 9.1 is retained. The fact that the connecting layer 11.1 is kept essentially free from shear forces in the way shown means that altogether the durability of the connection is improved and the performance and service life of the system as a whole are increased. In particular, creepage of the connecting layer 11.1 is reduced.

The distance of the groove 22 from the edge of the contact region 36 should in this case be chosen to be as small as possible. The annular design of the groove 22 is appropriate in particular for cases in which the optical element 9.1 is deformed or actuated with changing directions of the load or of the bending. In other applications, it is of course conceivable for the groove 22 to follow different paths, for example linear paths.

The groove 22 may be ground or milled in via a forming tool, that is to say a positive body. A further etching or polishing step may possibly be performed for eliminating or reducing damage at depth, whereby stress peaks and possible starting points of damage to the material under stress can be avoided.

Figure 8:
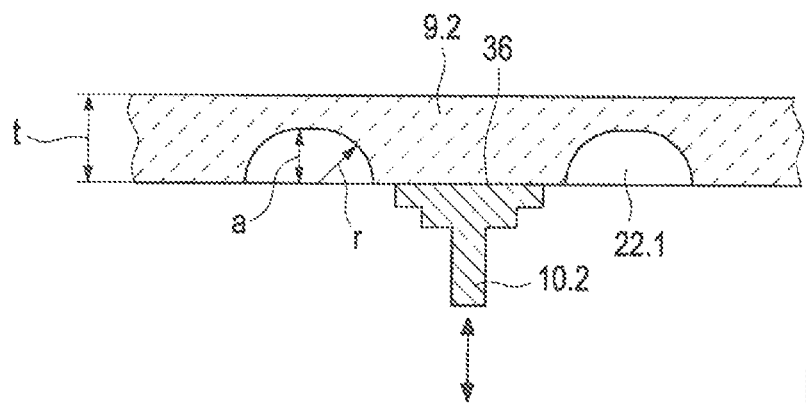
FIG. 8 shows a schematic representation of a further variant for the introduction of forces into an optical element.

FIG. 8 shows a variant in which the plunger 10.2 is formed in such a way that it tapers in the direction away from the optical element 9.2. This form of the plunger 10.2 is based on the recognition that, even with optimally designed grooves, a residual bending of the optical element in the content region can still be observed. A plunger of maximum stiffness would have the effect that stress peaks would occur in the edge regions of the contact region as a result of the bending referred to above. For this reason it is advantageous to design the plunger 10.2 to be more flexible toward the outer regions of the contact region 36, which is achieved by the plunger geometry that is shown in the figure. In this case, the effect referred to occurs both under tension and under compression.

Likewise represented in the figure are essential parameters for describing the system,
where
a is the groove depth
r is the radius of the groove 22.1 on the side of the groove 22.1 that is facing the contact region
t is the thickness of the optical element 9.2

When there is only a main direction of extension in the region of the connecting location, the introduction of a groove transversely to this direction may be sufficient for decoupling stress. An advantageous range for the groove depth a is:

$$\frac{1}{4} < \frac{a}{t} < \frac{3}{4}$$

When using a radius in the groove, the following range is of advantage:

$$\frac{1}{4} < \frac{r}{a} < 2$$

Further variants of plunger design are shown in FIGS. 9a and 9b on the basis of the modified plunger 10.3 or 10.4. Of advantage is the large shoulder shown in FIG. 8, the planar surface of which can be used as a reference in the mounting/adjusting process.

Figure 10:
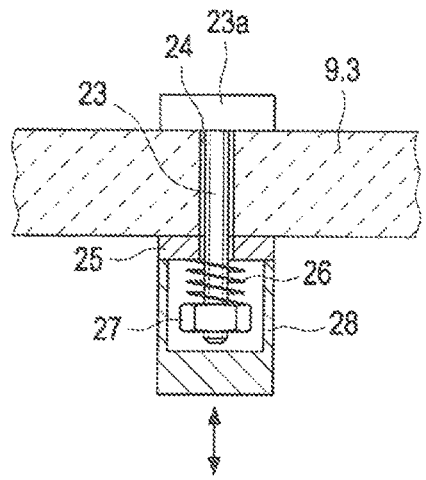
FIGS. 10a-10b show a further possibility for the introduction of forces into an optical element.
Figure 10:
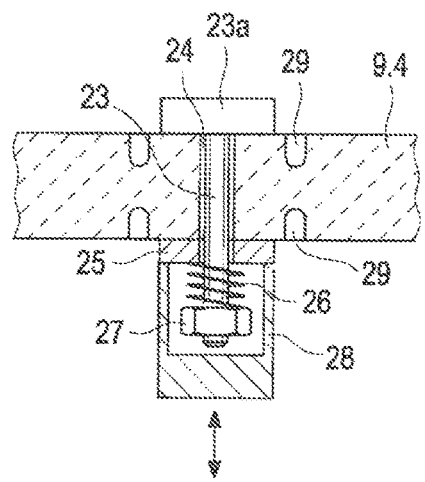

An advantageous specification for the boundary conditions to be applied when choosing the geometry of the plunger can be described by way of the range of the normal stress in the z direction, $$\frac{1}{3} < \frac{\sigma_{z,Interface,averaged}}{\sigma_{z,Interface,center}} < 1$$

where:
Interface, averaged: is the normal stress in z, measured over the cross section
Interface, center: is the normal stress in z in the center of the contact region or the adjacent regions in the plunger or optical element FIG. 10a shows a further variant, in which the optical element 9.3 is connected to an actuating unit by way of a clamping connection. For this purpose, a screw 23 is passed through a through-hole 24 in the glass of the optical element 9.3. On the side of the screw 23 or of the optical element 9.3 that is facing away from the screw head, first a washer 25, then a comparatively flexible spring 26 are arranged, and the spring is tightened with respect to the optical element 9.3 by way of a nut 27. A ram 28, which for its part is in mechanically operative connection with the actuating unit, acts on the washer 25. The effect of the spring 26 is essentially that it makes it possible for a defined clamping force to be applied. The spring constant should in this case be chosen such that, even with a maximum downward deflection of the optical element 9.3, the washer 25 does not lose contact with the optical element 9.3 and a situation that is difficult to control occurs. On the other hand, the spring constant is small enough to make appropriately sensitive setting of the clamping force possible. Typical values for the spring constant lie in the range of 1 N/μm-0.01 N/μm.

Figure 9:
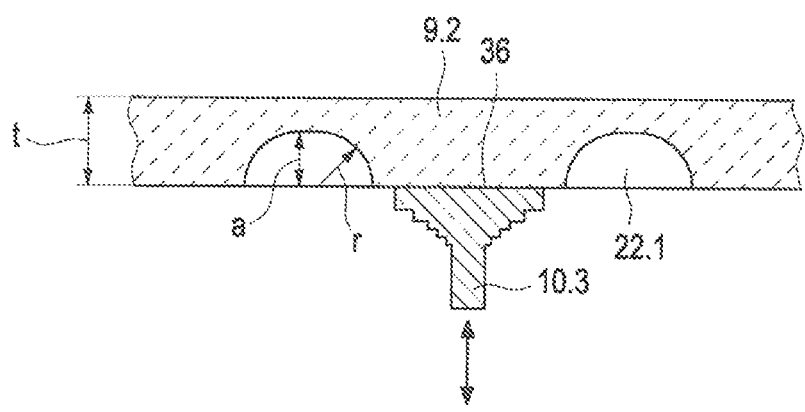
FIGS. 9a-9b show various variants for the design of a plunger.
Figure 9:
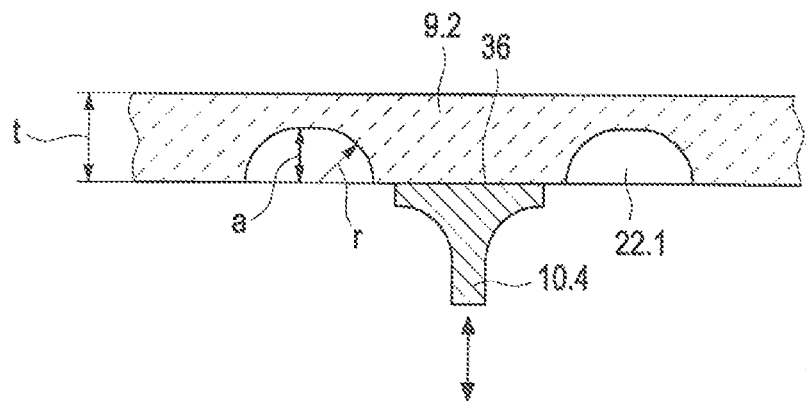

FIG. 10b shows the variant that has been modified with respect to FIG. 10a to the extent that now there are peripheral annular grooves 29 on both sides of the optical element 9.4, performing essentially the same function as that known from the previous FIGS. 7-9. The basis for the annular grooves 29 on both sides in FIG. 10b is that now a comparatively rigid element, specifically the screw head 23a, is in contact with the optical element 9.4 on the side thereof that is facing away from the actuator unit.

Figure 11:
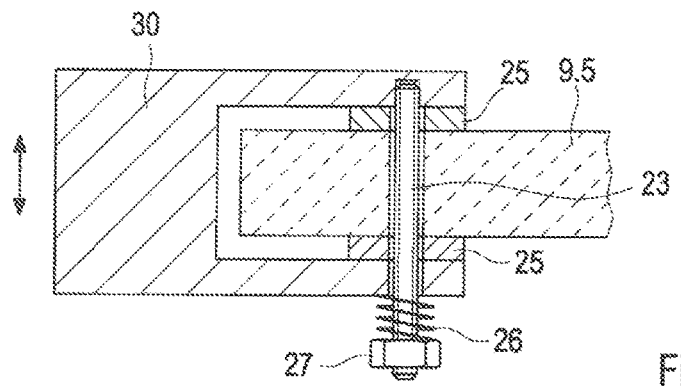
FIGS. 11a-11b show a further possibility for the introduction of forces into an optical element.
Figure 11:
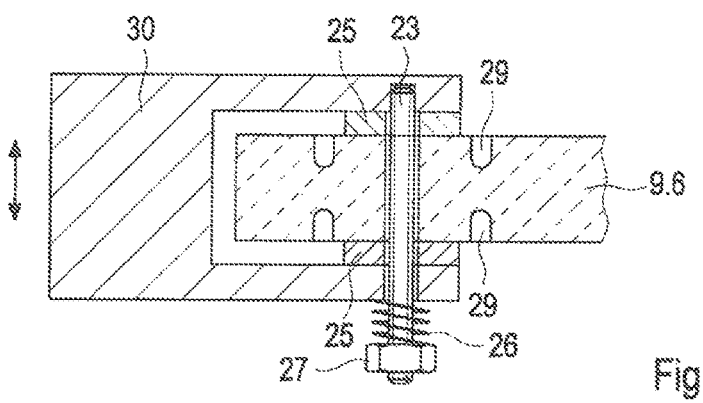

FIG. 11a shows an approach by which allowance is made for the limited installation space available underneath the optical element 9.5. The optical element 9.5 is in this case clamped in between the two arms of a clamp 30—likewise by using a screw 23 and a spring 26; the actuator unit in this case acts on the clamp 30 from outside, as indicated by the double-headed arrow. FIG. 11b corresponds to FIG. 11a, but in this case the optical element 9.6 is provided with the peripheral annular grooves 29 that are already known from the previous FIGS. 7-9.

The design of the external part of the groove is generally of far less relevance to the introduction of stress into the material of the optical element than the design of the part of the groove that is facing the contact region.

Figure 12:
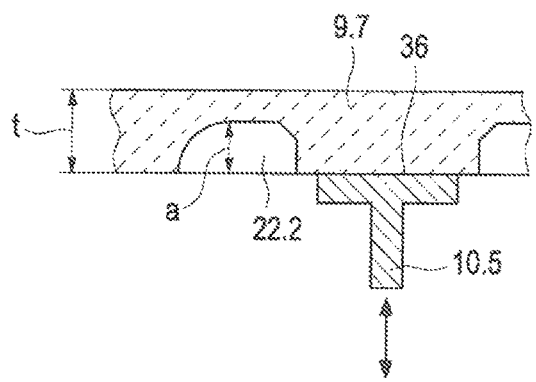
FIGS. 12a-12b show variants for the design of a groove.
Figure 12:
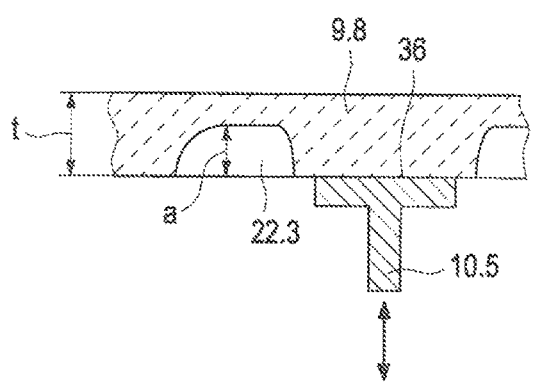

FIGS. 12a and 12b show a beveled design and an elliptical design of the part of the groove 22.2 and 22.3 that is facing the contact region 36 in the optical element 9.7 and 9.8. However, these are only two possible variants from a large number of possible designs of the groove 22; it goes without saying that free-form surfaces are also conceivable.

Figure 13:
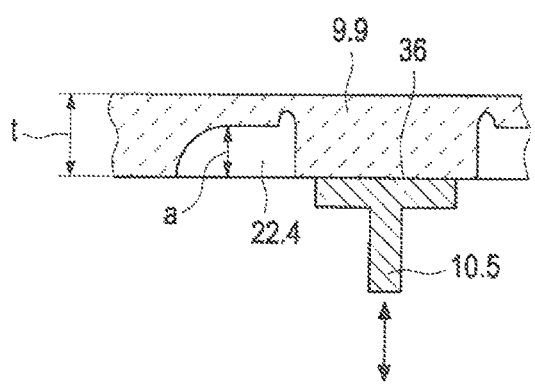
FIGS. 13a-13b show further variants for the design of a groove.
Figure 13:
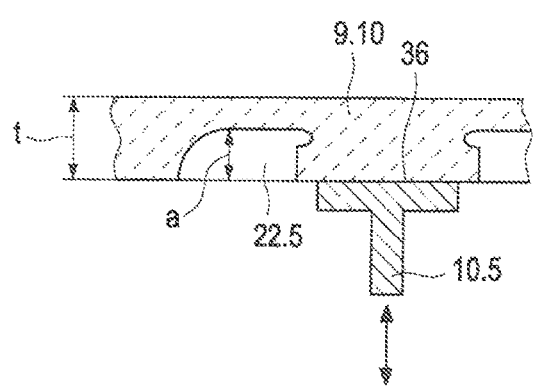

Likewise shown by way of example, in FIGS. 13a and 13b, is an undercut on the side of the groove 22.4 and 22.5 that is facing the contact region 36 in the optical element 9.9 and 9.10, respectively.

Figure 14:
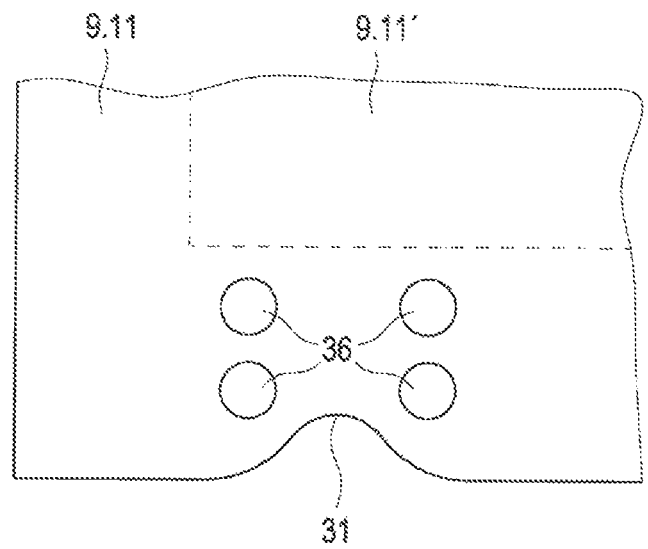
FIGS. 14a-14b show variants for the design of an optical element.
Figure 14:
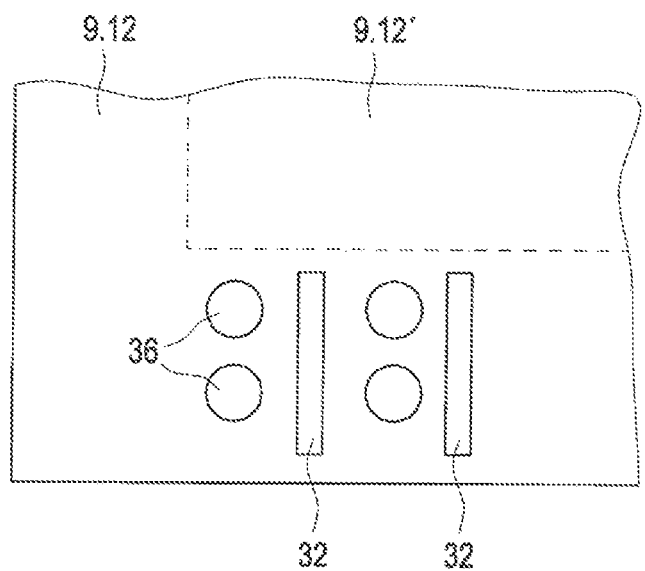

FIGS. 14a and 14b show a variant in which the optical element 9.11 and 9.12 is locally weakened in a specifically selective manner outside the optically active region 9.11' and 9.12', respectively, in order to reduce the forces involved for a deformation of the optical element 9.11 and 9.12. The optically active region is intended to be understood in this case as meaning the region of an optical element that is passed through by used radiation during the operation of the higher-level installation. In FIG. 14a, the optical element 9.11 is provided here at its edge with an indentation 31, whereas in FIG. 14b material is cut out in the optically non-active region, but in the interior of the optical element 9.12. The cutout 32 may be either right through or merely made as a notch. The optically non-active region is understood as meaning the region of the optical element that is not passed through by the used radiation that is used in the device during the operation of a high-level device in which the optical element is used. In both cases, appropriate weakenings of the material are formed at a distance from the contact region 36.

Figure 15:
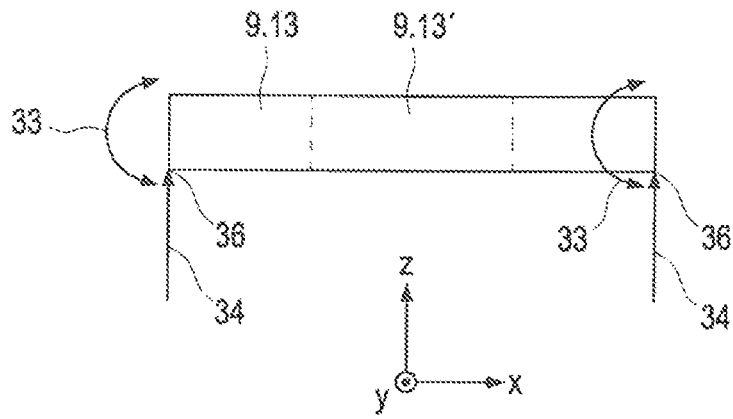
FIGS. 15a-15b show further variants for the introduction of forces into an optical element.
Figure 15:
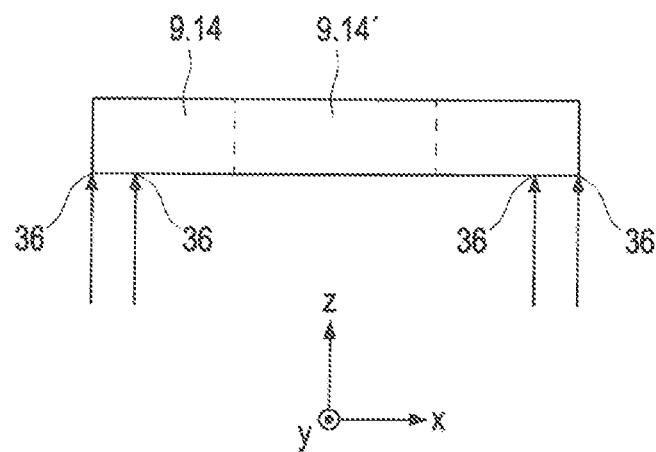

FIGS. 15a and 15b show two different possibilities for the introduction of forces and moments into an optical element. In the variant shown in FIG. 15a, forces and moments are introduced into the material of the optical element 9.13 in the edge region of the optical element 9.13, that is to say outside the optically active region 9.13', respectively at a common point of attack, as illustrated by the arrows 33 and 34. A disadvantage of the solution that is shown in FIG. 15a is that in this case a decoupling of the force and moment in the contact region 36 is only possible to a very restricted extent because a great stiffness in the actuating direction is advantageous, which is contrary to the decoupling property, and considerable stresses occur in the contact region 36 of the actuating unit used (not represented in the figure) in the optical element 9.13 to achieve a desired flexural deformation of the optical element 9.13, in particular in the x direction. FIG. 15b shows a variant in which two contact regions 36, in which forces for the deformation of the optical element 9.14 can act, are respectively provided on each side of the optical element 9.14 outside the optically active region 9.14'. The introduction of moments, in particular of tangential moments, takes place in the example shown by different forces in each case acting at contact regions 36 that are at a distance from one another in the x direction. In other words, the desired bending moment is applied simply by appropriately choosing the difference in the forces introduced. The respective absolute values of the forces can then be set independently of the difference mentioned. This gives rise to increased possibilities for the deformation of the optical element 9.14, and similarly to a reduction in the stresses that are introduced into the material of the optical element 9.14 in the contact regions 36. Furthermore, a desired ratio of the two forces can be set by way of the distance between the two contact regions 36, without the desired moment having to be changed, so that an optimization of the stress becomes possible.

A tangential moment should be understood in this connection as meaning in particular a moment at which the vector or the axis of the bending moment extends parallel to the edge region of the optical element, that is to say in particular parallel to an edge of a plane-parallel plate. In this case, the forces applied for applying the bending moment may differ not only with respect to their absolute amount but also in particular with respect to their direction.

Figure 16A:
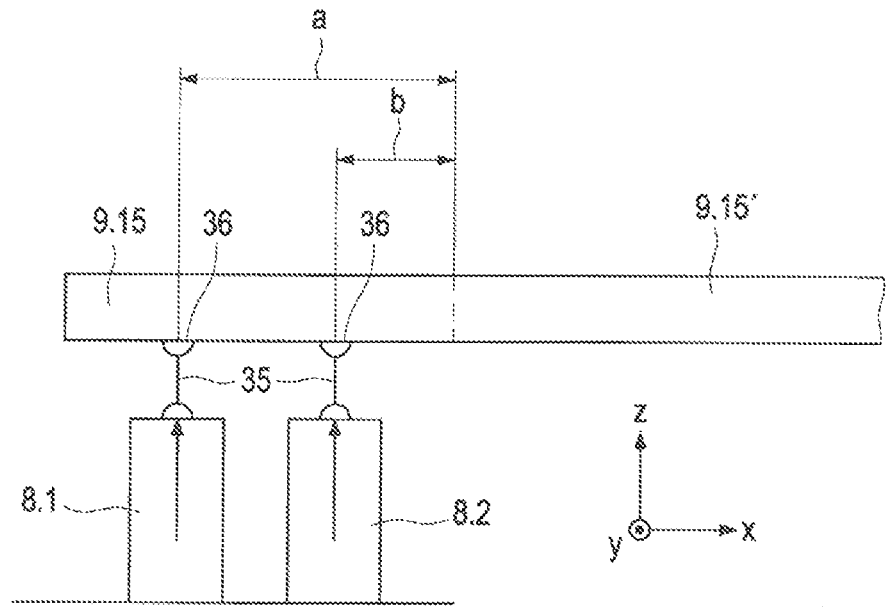
FIGS. 16a-16b show a schematic representation of the introduction of a force or a moment into an optical element.
Figure 16B:
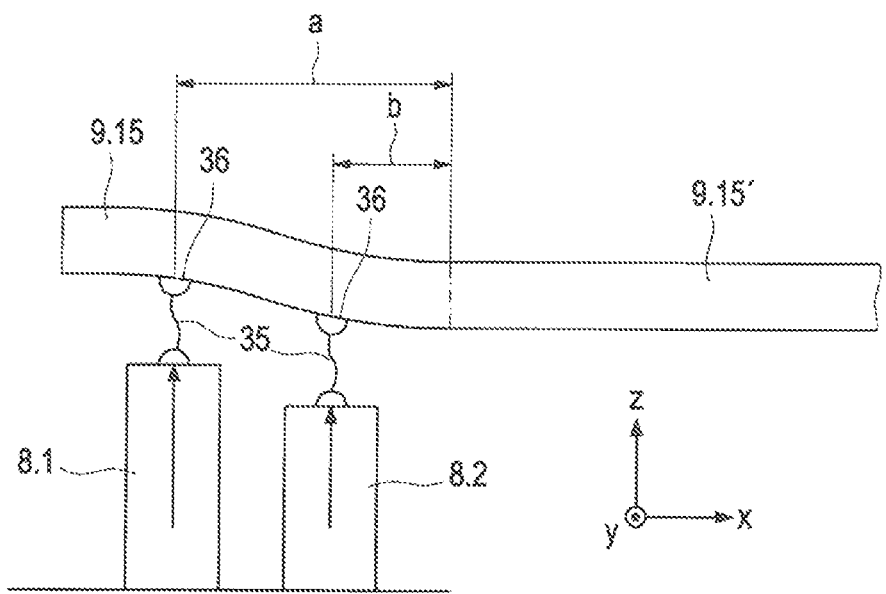

FIGS. 16a and 16b show a schematic representation of the introduction of a force or moment as described above. In this case, the force is introduced by an actuating unit into the edge region of an optical element 9.15 by way of an articulated joint 35 respectively at two contact regions 36. The parameter b that is shown in the figure in this case denotes the distance from the inner contact region to the optically active region 9.15' of the optical element 9.15, whereas the parameter a denotes the distance from the outer contact region 36 to the optically active region 9.15' of the optical element 9.15. In this case, the site of action for the desired force or the desired moment coincides with the edge of the optically active region 9.15'. FIG. 16b shows the actuated case, in which different forces are applied by way of the actuating units 8.1 and 8.2, so that both a force and a torque act at the site of action. The effect of the decoupling joints 35 between the actuating units 8.1 and 8.2 and the optical element 9.15, which avoid high stresses in the contact region 36 or in the area surrounding it, can be seen well in the figure. In particular, the decoupling joints 35 bring about the effect that tensile and compressive forces are primarily transferred to the contact region 36. If the contact region 36 is chosen to be sufficiently large, altogether lower tensile and compressive forces are obtained. In the most general case, the decoupling effect of the decoupling joint 35 may be realized in all directions of the x/y plane. This can be achieved for example with a thin round wire or a Cardan joint. In the case of the bending of the optical element 9.15 only about one axis, a decoupling effect of the decoupling joint 35 about this axis is sufficient; in this case, a leaf spring may be used. The following advantageously applies for the stiffness ratio of the joint in the z and x/y directions: $2 < k_z/k_{xy} < 100$ with k as the spring constant.

Figure 17:
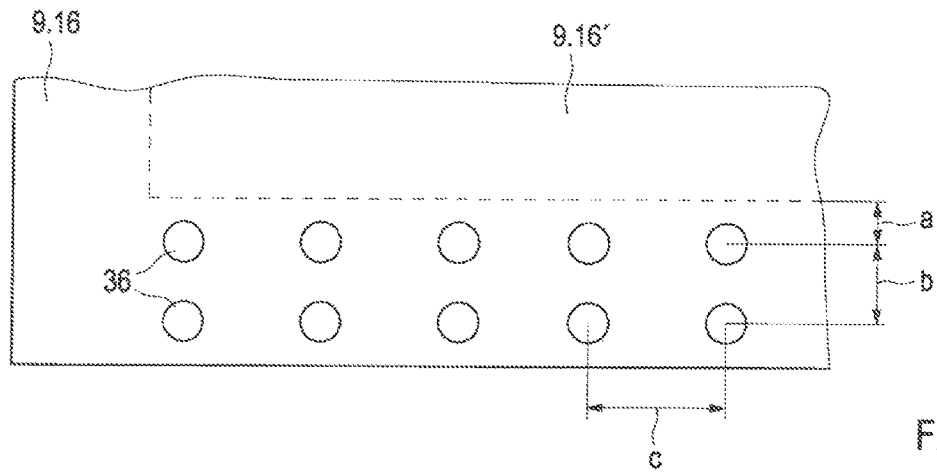
FIG. 17 shows an exemplary distribution of contact regions on an optical element.

FIG. 17 shows an exemplary distribution of contact regions 36 outside the optically active region 9.16' of the optical element 9.16. The contact regions 36 are in this case arranged in a regular grid, where a is the distance of the inner contact regions from the optically active region 9.16' and b is the distance of the outer contact regions 36 from the inner contact regions 36. The distance of the contact regions 36 from one another in the longitudinal direction of the optical element 9.16 is denoted by c. An irregular arrangement of the contact regions is also conceivable in principle.

It should be the in this case about the distance a that it is endeavored to arrange the contact regions 36 as close as possible to the optically active region 9.16', that is to say that a should be chosen to be as small as possible. The distance b has a direct effect on which torque can be introduced into the optical element 9.16 in the tangential direction with a prescribed actuator force. Distance c should be chosen such that the desired resolution of the deformation can be achieved. In simplified terms, the waviness that can be represented by the optical element 9.16 increases with decreasing distance c. It goes without saying here that distance c does not necessarily have to be the distance from a wave peak to a wave trough. A wave may also run over a multiplicity of contact regions 36. In addition, the surface profile of the actuated optical element 9.16 does not necessarily have to be constant in the y direction. Instead of at a wave peak for small y, the optical element 9.16 may no longer have any deformation toward its middle and subsequently form a wave trough. The neutral region also does not necessarily have to lie in the middle; it goes without saying that a multiplicity even of extremely irregular profiles can be set through the shown optical element 9.16 with the corresponding actuator system. The distance a of the centers of the first row of contact regions 36 from the optically active region 9.16' of the optical element 9.16 does not have to be constant here. In order to keep down the forces, and consequently the stresses, in the optical element 9.16, and thereby prevent component failure, it is advantageous to choose the value in the range of 1 mm to 10 mm.

The distance b of the centers of the contact regions 36 of the second row from that of the first row is advantageously chosen in the range of 2 to 10 mm. If the distance is chosen to be too small, excessive forces are involved to introduce an adequate tangential moment. If the distance is too great, on the other hand, excessive forces are involved to be able to introduce the desired deformations into the optically active region 9.16'.

It is advantageous to choose for the distance c a value in the range of 8 to 40 mm.

Figure 18:
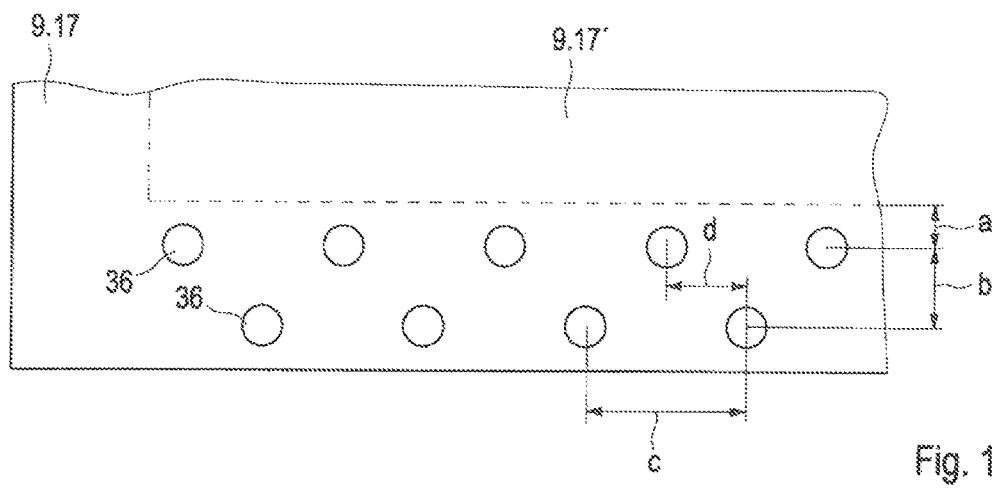
FIG. 18 shows a further variant for the distribution of contact regions on an optical element.

FIG. 18 shows a variant of the arrangement shown in FIG. 17 of the contact regions 36 outside the optically active region 9.17'. In this case, the contact regions 36 are arranged offset with respect to one another in two rows, the lateral offset of the respective contact regions 36 of the two rows in relation to one another being denoted here by the parameter d. Here, too, the introduction of a tangential moment into the optical element 9.17 is possible.

It is altogether of advantage to choose the number of contact regions in a range between 14 and 64. In this range, a sufficient deformation resolution of the optical element is achieved with still reasonable structural expenditure.

Exemplary possible variants of the arrangement of measuring points on the optical element are explained below on the basis of FIGS. 19 to 21.

Figure 19:
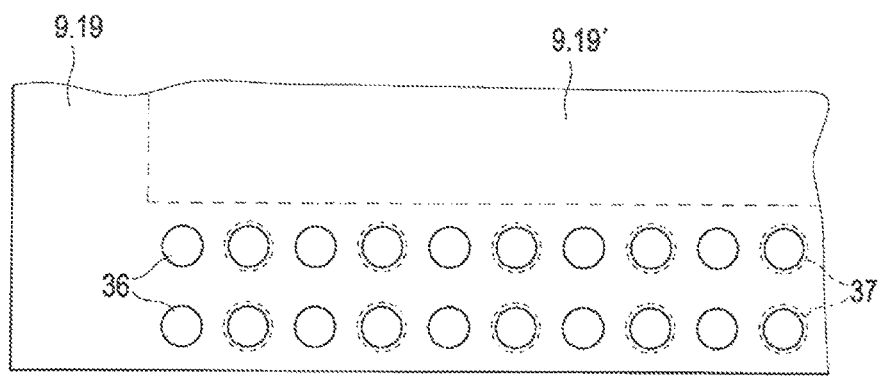
FIG. 19 shows a variant for the arrangement of measuring points and contact regions on an optical element.
Figure 20:
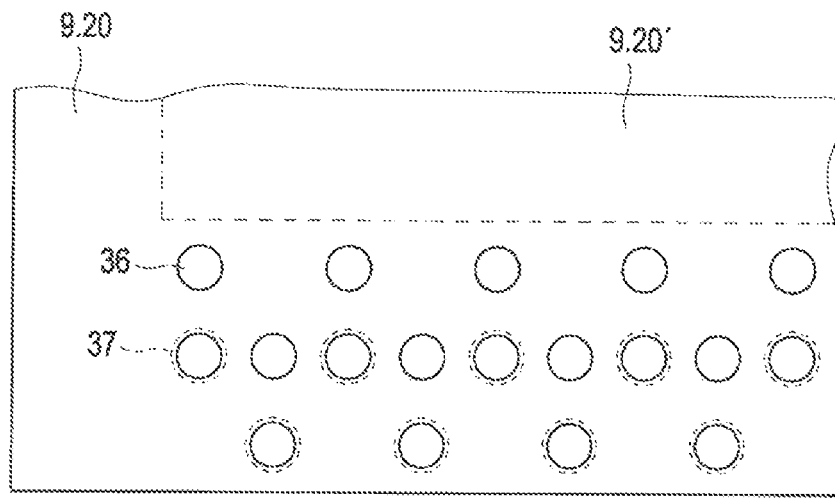
FIG. 20 shows a further variant for the arrangement of measuring points and contact regions on an optical element.
Figure 21:
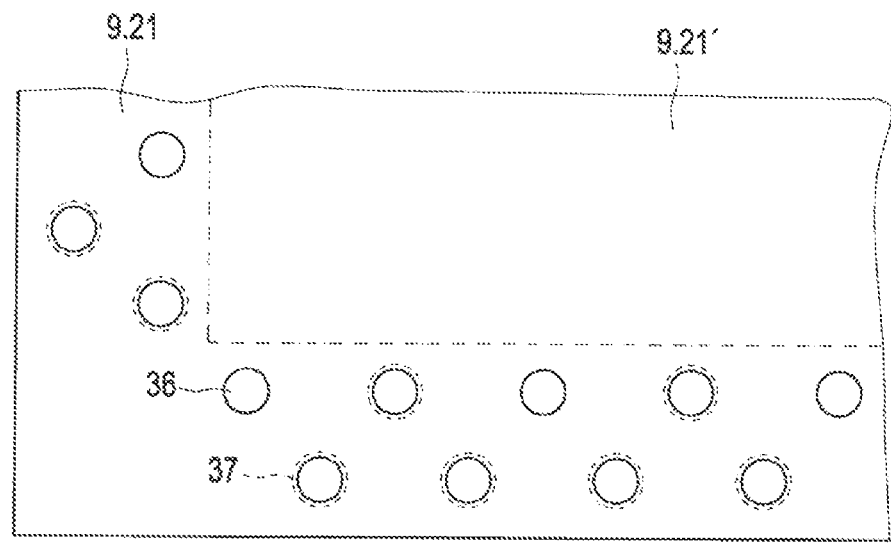
FIG. 21 shows a further variant for the arrangement of measuring points and contact regions on an optical element.

Both FIG. 19 and FIG. 20 show a variant in which the measuring points 37 or measuring regions that are represented by dashed lines are arranged outside the optically active region 9.19' and 9.20', respectively, and are offset from the contact regions 36. This opens up the possibility of both actuating and measuring from the same side of the optical element 9.19 and 9.20, so that the optical element 9.19 and 9.20 can be brought up on the opposite side comparatively close to adjacent components of a projection exposure apparatus (for example the reticle). In principle, the measurement may take place directly on the surface of the optical element 9.19 and 9.20. Alternatively, it is also conceivable, as already described, to measure indirectly by an actuating unit.

In an alternative variant of the disclosure that is not represented, the measuring points are located in the contact regions or in the regions on the other face of the optical element that lies opposite from the contact regions (on the face of the optical element on which the contact points do not lie).

In this case, measuring may possibly be carried out close to the optically active region of the optical element, so that the measuring accuracy, and consequently the performance, of the system overall increases. It goes without saying that, as represented by way of example in FIG. 21, both the contact regions 36 and the measuring points 37 may be arranged outside the optically active region 9.21' on the short side of a rectangular optical element 9.21.

It is of advantage to arrange the measuring points 37 in at least two rows in order to be able to control the drift behavior of the sensors better. In the case where only one row of sensors is used, the drift of a sensor produces much greater parasitic deformations in the optically active region and reduces the performance of the system, whereby the optical element is more poorly conditioned from the technical control aspect. When there is drift of a sensor, in this case all of the actuating units are moved in order to correct this—erroneously measured—deformation. If all of the measuring points lie in one line, there is no control or little control in the y direction, as a result of which the deformation in the optically active region of the optical element, and consequently the optical error, increases.

The introduction of a tangential moment is important in particular because a waviness produced at the edges of the optical element 9.21 can also continue into the interior, that is to say the optically active region 9.21' of the optical element 9.21. Without the application of an additional tangential moment, the desired waviness would possibly only occur at the edges, that is to say in particular also in the optically non-active region of the optical element 9.21, and the manipulator would not have its effect.

The technical solutions shown in FIGS. 17-21 may be realized in combination with any desired subset of the further technical solutions that are shown here; it is also conceivable for it to be realized independently of these.

When choosing the thickness of the optical element in the z direction, various factors have to be taken into consideration. Especially, the stresses introduced into the material of the optical element, in particular in the area surrounding the contact regions, depend strongly on the thickness of the optical element. In an extreme case, such stresses may lead to failure of the component. Consequently, the optical correction potential is reduced in the case of thick optical elements by the stress-dependent limitation of the maximum deflections of the corresponding actuating units by the plate thickness. In addition, the parasitic effect of the stress birefringence increases in the case of thicker optical elements, as a result of which the performance of the system as a whole is reduced.

The aforementioned aspects consequently suggest the choice of an optical element that is as thin as possible. However, essentially for the reasons described below, there is a lower limit to the thickness of the optical element. Firstly, a plane-parallel optical element can only be produced cost-effectively with a certain minimum thickness; secondly, it is desirable to maintain a certain intrinsic stiffness of the optical element in order to keep down as much as possible its susceptibility to harmful ambient conditions, such as for example pressure surges from the surrounding gas.

It has been found that an advantageous choice for the thickness of the optical element lies in the range of 1.2 mm to 7 mm, in particular in the range of 1.2 mm to 4 mm. In an advantageous variant, the choice of an optical element that is as thin as possible can be made possible by the measure that is represented on the basis of FIG. 22 below.

Figure 22:
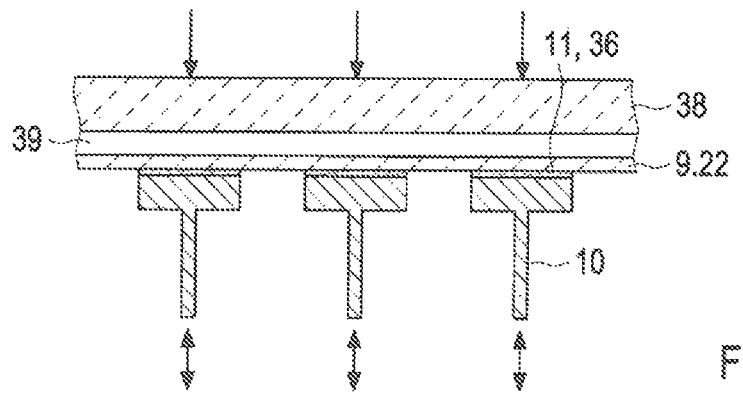
FIG. 22 shows a variant for the protection of an optical element from pressure surges.

FIG. 22 shows a variant in which the optical element 9.22 that is mounted on the plungers 10 by way of the connecting layer 11 is shielded from harmful environmental influences, in particular from pressure surges caused by the movement of the reticle stage, via a protective plate 38 arranged between it and the reticle. The protective plate 38 may in this case be chosen to be comparatively thick, in particular with a thickness in the range of 4 mm-10 mm. The maximum possible thickness of the protective plate 38 is limited essentially by the installation space available and by a limitation of the maximum light path by glass in the system. The protective plate 38 may in this case be arranged in particular on the base frame. Sealing from the surroundings can then be achieved by the nonactuated protective plate 38 being sealed with respect to an upper termination of the base frame, which as a result of the rigid connection of the protective plate 38 to the base frame is much easier than sealing of the actuated optical element 9.22 with respect to the base frame. A gas chamber 39, which is only connected to the outside by an inflow and an outflow and can be purged in a defined manner, is thereby created essentially between the protective plate 38 and the optical element 9.22.

The pressure loads that act on the protective plate 38 from the surroundings are indicated by the arrows.

It is advantageous in principle to mount the protective plate 38 on the base frame by way of three bearing points. In this case, errors that could be caused by a thermal deformation of the protective plate 38 or the base frame are minimized.

Figure 23:
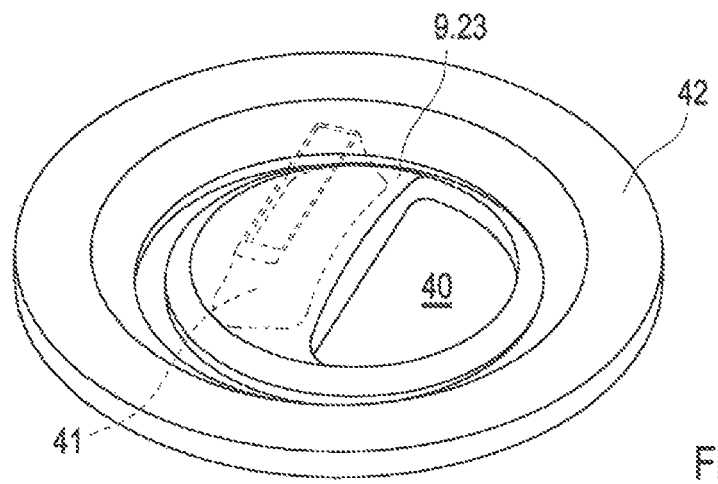
FIG. 23 shows a possibility for the design of an optical element.

FIG. 23 shows a variant of the design of an optical element 9.23 in connection with the manipulator described above. In this case, an optical element 9.23 that is produced for example from quartz glass or calcium fluoride is provided with a breakout 40 in the region that is not passed through by the used optical radiation during the customary operation of the higher-order projection exposure apparatus 100. The envelope 41 of the beam path through the optical element 9.23 is likewise indicated in FIG. 23 and in the following FIGS. 24 and 25. The optical element 9.23 is in this case arranged in the customary way in a mount 42, which may in particular be arranged between the manipulator and a further element of a lens. The fact that the optical element 9.23 that is shown in the figure is provided with the breakout 40 means that installation space can be created for components of the structurally higher-level unit, for example the manipulator 200, so that altogether an increased packing density of optical elements in a projection exposure apparatus is achieved. In addition, weight is saved, and the breakout 40 also creates the possibility of optimizing or controlling the flow of a purge gas in the system.

Figure 24:
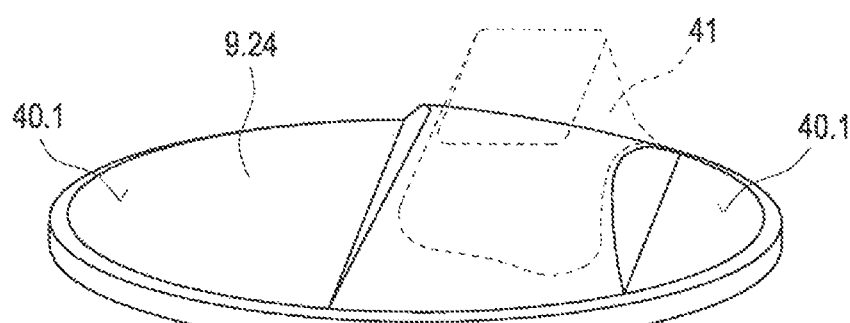
FIGS. 24a-24b show a variant of the design shown in FIG. 23.
Figure 24:
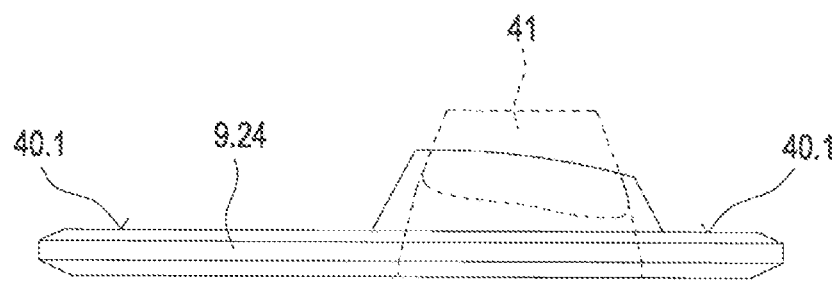
Figure 25:
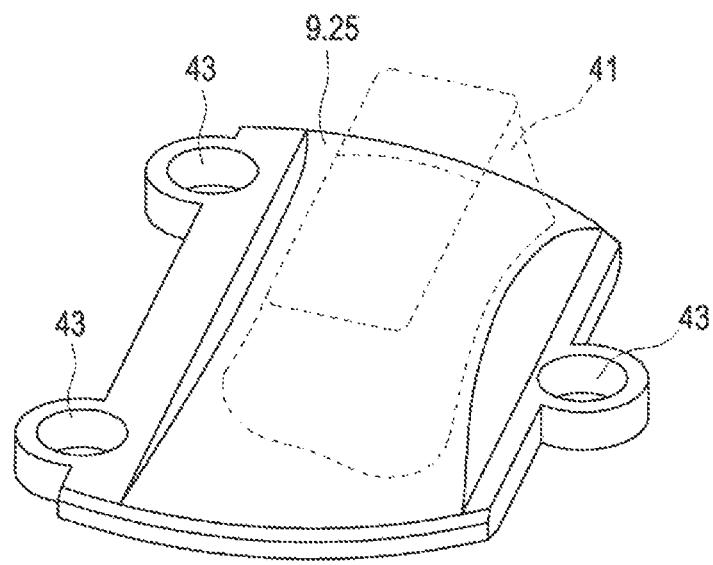
FIGS. 25a-25b show a further variant of the design of an optical element.
Figure 25:
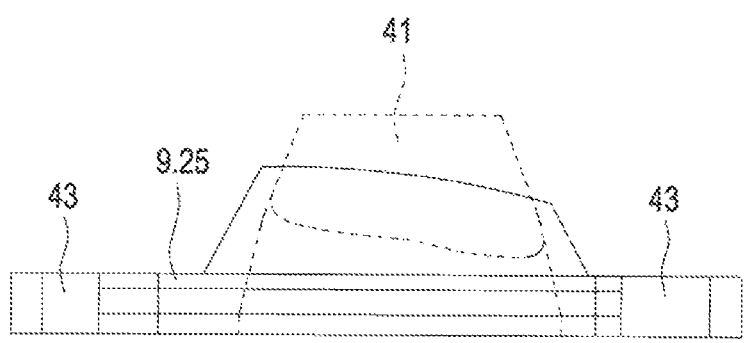

FIGS. 24a and 24b show a variant of the solution shown above; the optical element 9.24 is not provided there with a complete breakout, but rather is milled away in the optically unused regions 40.1. FIG. 24a presents a perspective view of the optical element 9.24, whereas FIG. 24b is depicted as a lateral view. The material weakenings 40.1 and breakouts 40 that are shown in FIGS. 23 and 24 may be produced for example in a final machining step in the production of the optical element by milling or similar production processes, such as for example grinding.

A further variant of the embodiment shown in FIGS. 23 and 24a-24b is FIGS. 25a and 25b. FIG. 25a shows a perspective view of the corresponding variant, whereas FIG. 25b presents a lateral view.

In the example shown in FIG. 25a-25b, the outer contour of the optical element 9.25 is not of an annular configuration, but rather 3 eyelets 43, through which the optical element 9.25 can be screwed for example to the mount of a further optical element of a projection lens or be mounted on hemispherical bosses, are formed in the example shown. Dispensing with the annular contour allows additional installation space to be gained here; furthermore, the overall mass of the optical element 9.25 is reduced further, which has considerable advantages with respect to use of the optical element 9.25 in a manipulator.

Figure 26:
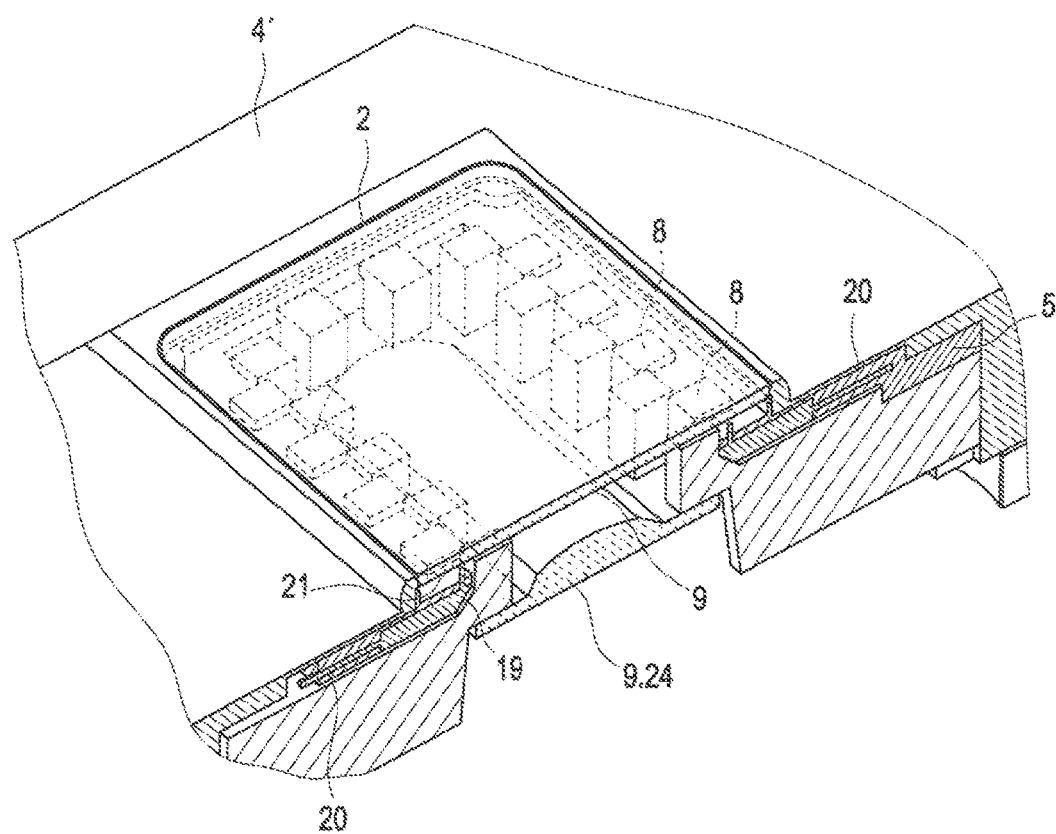
FIG. 26 shows an exemplary representation of an optical element in connection with a manipulator.

FIG. 26 shows by way of example a use of the optical element with a manipulator 200, it being evident how the remaining part of the optical element protrudes into the free installation space in the manipulator 200.

The technical features that are explained on the basis of FIGS. 23 to 26 are reproduced once again below, structured in the form of items that are numbered and refer back to one another.

1. A projection exposure apparatus for semiconductor lithography, having a manipulator for the correction of wavefront aberrations of the used optical radiation that passes through an optical element of the manipulator during the operation of the projection lens, an optical element which is provided with a material weakening in the region that is not passed through by the used optical radiation during the customary operation of the projection exposure apparatus being arranged adjacent to the manipulator in the light path, characterized in that the part of the optical element that is not provided with the material weakening protrudes into a clearance produced by the geometry of the manipulator and/or in that at least part of the manipulator protrudes into the region of the material weakening.
2. The projection exposure apparatus as provided by item 1, characterized in that the material weakening is a breakout.
3. The projection exposure apparatus as provided by item 1, characterized in that the material weakening is a milled-away portion or ground-away portion.
4. The projection exposure apparatus as provided by one of the preceding items, characterized in that the outer contour of the optical element deviates from the form of a ring, eyelets for the fastening or mounting of the optical element being present on the optical element.
5. The projection exposure apparatus as provided by one of the preceding items, characterized in that
the manipulator is arranged directly after a reticle of the projection exposure apparatus in the direction of the used optical radiation.

For the purpose of the aforementioned items, a material weakening is intended to be understood as meaning in particular the absence of material, whereby an originally existing or merely imaginary complete form of the optical element has been reduced or become incomplete. It is for example conceivable that the optical element is a body of revolution, in particular a spherical, rotationally symmetrical lens element with a clearance, the rotational symmetry being broken as a result of the presence of the clearance. It is in this case immaterial whether a complete optical element has first been produced and then reworked or whether the material weakening was already provided in the design of the optical element, so that no reworking was involved to produce the material weakening. In other words, an optical element provided with a material weakening may be understood as meaning in particular an optical element which, when viewed by a person skilled in the art, would be imagined as completed in a form of an optical element that is familiar to such a person.

The material weakening is consequently a deviation from the customary form of concave or convex lens elements that goes beyond the material weakenings associated with the creation of free-form surfaces or aspheres, in particular even by orders of magnitude. In particular, an optically non-effective region is produced. The material weakening may for example also be bordered by a discontinuous profile of the surface of the optical element, such as for example an edge.

What is claimed is:

1. An apparatus, comprising:
    a deformable optical element configured to correct wavefront aberrations; and
    actuating units configured to deform the optical element, wherein:
        the actuating units are in mechanical contact with the optical element via contact regions arranged in an arrangement outside an optically active region of the optical element;
        the contact regions comprise a first group of contact regions and a second group of contact regions different from the first group of contact regions;
        for each contact region in the first group of contact regions, the contact region has a center point which is within three millimeters to 12 millimeters of an edge of the optically active region;
        relative to the contact regions of the first group of contact regions, the second group of contact regions are remote from the optically active region of the optical element;
        measuring points configured for sensors are offset from the contact regions;
        the measuring points are arranged in at least two rows; and
        the apparatus is a semiconductor lithography projection exposure apparatus.

2. The apparatus of claim 1, wherein:
    for each contact region in the second group of contact regions, the contact region has a center point;
    each contact region of the first group has a closest contact region of the second group; and
    for each contact region of the first group, its center point is within two millimeters to 10 millimeters of the center point of its closest contact region of the second group.

3. The apparatus of claim 2, wherein for at least some of the contact regions of the second group of contact regions:
    the contact regions are arranged in a row; and
    a distance of center points of the contact regions are in a range between 8 and 30 mm.

4. The apparatus of claim 3, wherein the contact regions in at least two rows are arranged offset from one another.

5. The apparatus of claim 1, wherein the measuring points are on a face of the optical element that is opposite from the contact regions.

6. The apparatus of claim 1, wherein the measuring points are on the same face of the optical element as the contact regions.

7. The apparatus of claim 1, wherein for at least some of the contact regions of the second group of contact regions:
    the contact regions are arranged in a row; and
    a distance of center points of the contact regions are in a range between 8 and 30 mm.

8. The apparatus of claim 1, wherein the contact regions are arranged in at least two rows which are offset from one another.

9. The apparatus of claim 1, wherein the apparatus comprises a projection lens, and the projection lens comprises the optical element.

10. The apparatus of claim 9, further comprising an illumination device.

11. The apparatus of claim 10, wherein the illumination device is configured to illuminate a mask, and the projection lens is configured to project an image of the mask onto a wafer.

12. The apparatus of claim 11, further comprising a light source.

13. The apparatus of claim 12, wherein the light source comprises a laser.

14. The apparatus of claim 10, further comprising a stage configured to hold a mask.

15. The apparatus of claim 14, wherein the illumination device is configured to illuminate the mask, and the projection lens is configured to project an image of the mask onto a wafer.

16. The apparatus of claim 15, further comprising a light source.

17. The apparatus of claim 16, wherein the light source comprises a laser.

18. The apparatus of claim 14, further comprising a device configured to hold a wafer.

19. The apparatus of claim 14, wherein the illumination device is configured to illuminate the mask, and the projection lens is configured to project an image of the mask onto the wafer.

20. The apparatus of claim 19, further comprising a light source.

* * * * *

UNITED STATES PATENT AND TRADEMARK OFFICE
CERTIFICATE OF CORRECTION

| | | |
|---|---|---|
| PATENT NO. | : 10,025,200 B2 | Page 1 of 1 |
| APPLICATION NO. | : 15/345938 | |
| DATED | : July 17, 2018 | |
| INVENTOR(S) | : Pascal Marsollek et al. | |

It is certified that error appears in the above-identified patent and that said Letters Patent is hereby corrected as shown below:

In the Specification

Column 8, Line 33, after "via" delete "a".

Column 15, Line 26, delete "nonactuated" and insert -- non-actuated --.

Column 16, Line 10, delete "FIG." and insert -- FIGS. --.

Signed and Sealed this
Ninth Day of April, 2019

Andrei Iancu
*Director of the United States Patent and Trademark Office*